United States Patent
Watanabe et al.

(10) Patent No.: US 7,947,560 B2
(45) Date of Patent: May 24, 2011

(54) METHOD OF NICKEL DISILICIDE FORMATION AND METHOD OF NICKEL DISILICATE SOURCE/DRAIN FORMATION

(75) Inventors: Yukimune Watanabe, Tsukuba (JP); Nobuyuki Mise, Tsukuba (JP); Shinji Migita, Tsubuka (JP)

(73) Assignees: Seiko Epson Corporation, Tokyo (JP); Renesas Technology Corporation, Tokyo (JP)

( * ) Notice: Subject to any disclaimer, the term of this patent is extended or adjusted under 35 U.S.C. 154(b) by 265 days.

(21) Appl. No.: 11/708,614

(22) Filed: Feb. 21, 2007

(65) Prior Publication Data
US 2007/0202692 A1     Aug. 30, 2007

(30) Foreign Application Priority Data
Feb. 27, 2006   (JP) ................... 2006-050416

(51) Int. Cl.
*H01L 21/336*   (2006.01)
*H01L 21/44*    (2006.01)
*H01L 21/3205*  (2006.01)
*H01L 21/00*    (2006.01)

(52) U.S. Cl. ........ 438/303; 438/581; 438/586; 438/795; 257/E21.619

(58) Field of Classification Search ............ 438/581, 438/289, 303, 305, 306, 586; 257/E21.619
See application file for complete search history.

(56) References Cited

U.S. PATENT DOCUMENTS

| | | | | |
|---|---|---|---|---|
| 5,168,332 | A * | 12/1992 | Kunishima et al. | 257/385 |
| 5,840,626 | A * | 11/1998 | Ohguro | 438/649 |
| 6,998,153 | B2 * | 2/2006 | Chiang et al. | 427/255.11 |
| 2005/0059242 | A1 * | 3/2005 | Cabral et al. | 438/682 |
| 2005/0156269 | A1 * | 7/2005 | Lee et al. | 257/486 |
| 2005/0189652 | A1 * | 9/2005 | Nakatsuka et al. | 257/757 |
| 2005/0285209 | A1 * | 12/2005 | Inoh et al. | 257/390 |

OTHER PUBLICATIONS

T. Ohguro et al., "Nitrogen-doped nickel monosilicide technique for deep submicron CMOS salicide," IEDM95, pp. 453-456, 1995.
Osamu Nakatsuka et al., "Low-temperature Formation of Epitazial NiSi₂ Layers with Solid-Phase Reaction in Ni/Ti/Si(001) Systems," Japanese Journal of Applied Physics, vol. 44, No. 5A, pp. 2945-2947, 2005.

* cited by examiner

*Primary Examiner* — Hsien-ming Lee
*Assistant Examiner* — Kevin Parendo
(74) *Attorney, Agent, or Firm* — Oliff & Berridge, PLC

(57) ABSTRACT

A method for forming silicide includes the steps of: forming a nickel film on a silicon layer (or a silicon substrate); introducing nitrogen into at least one of the nickel film and the interface between the nickel film and the silicon layer (or the silicon substrate); and after the introduction of the nitrogen, applying heat treatment to the nickel film and the silicon layer (or the silicon substrate) under predetermined conditions to form a nickel disilicide layer.

8 Claims, 14 Drawing Sheets

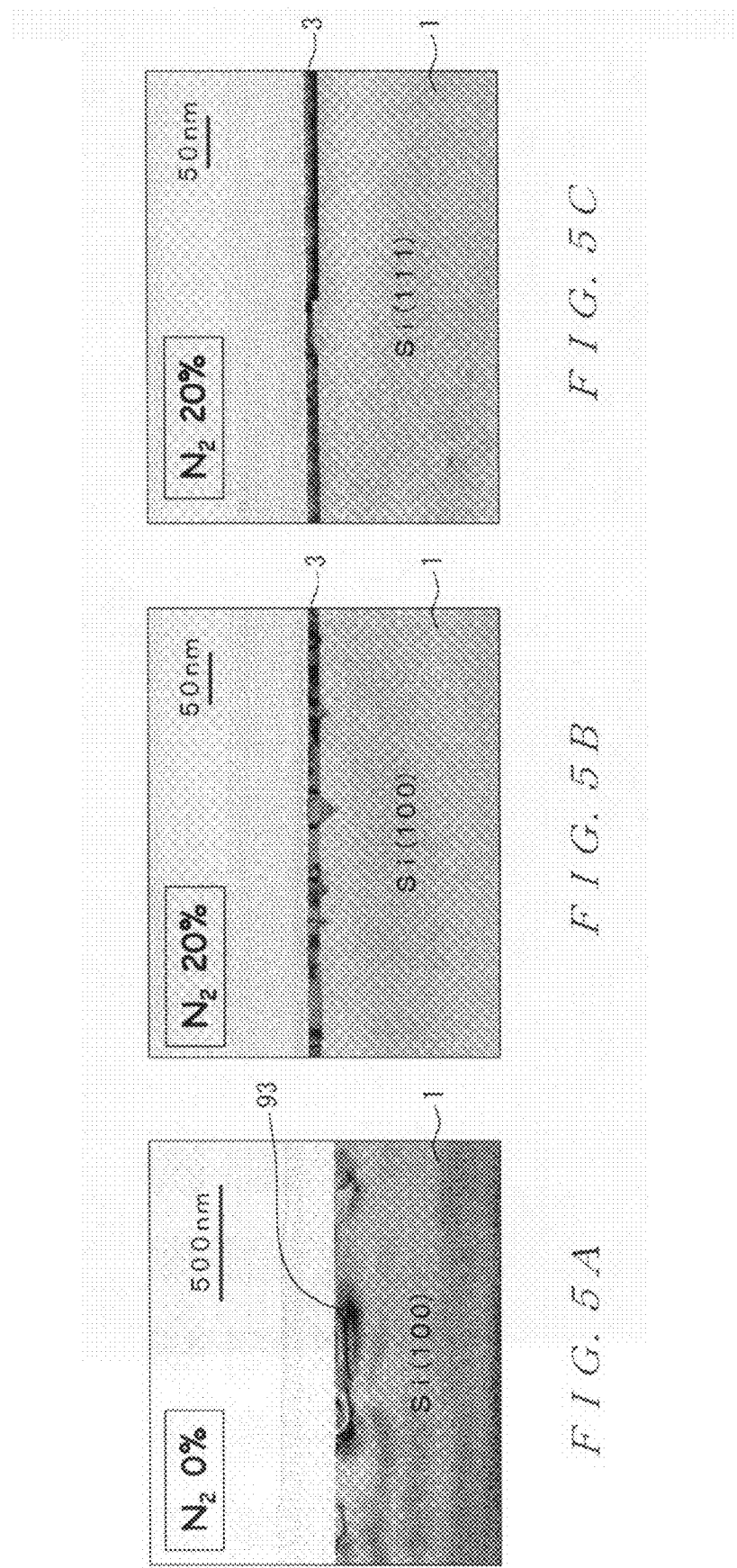

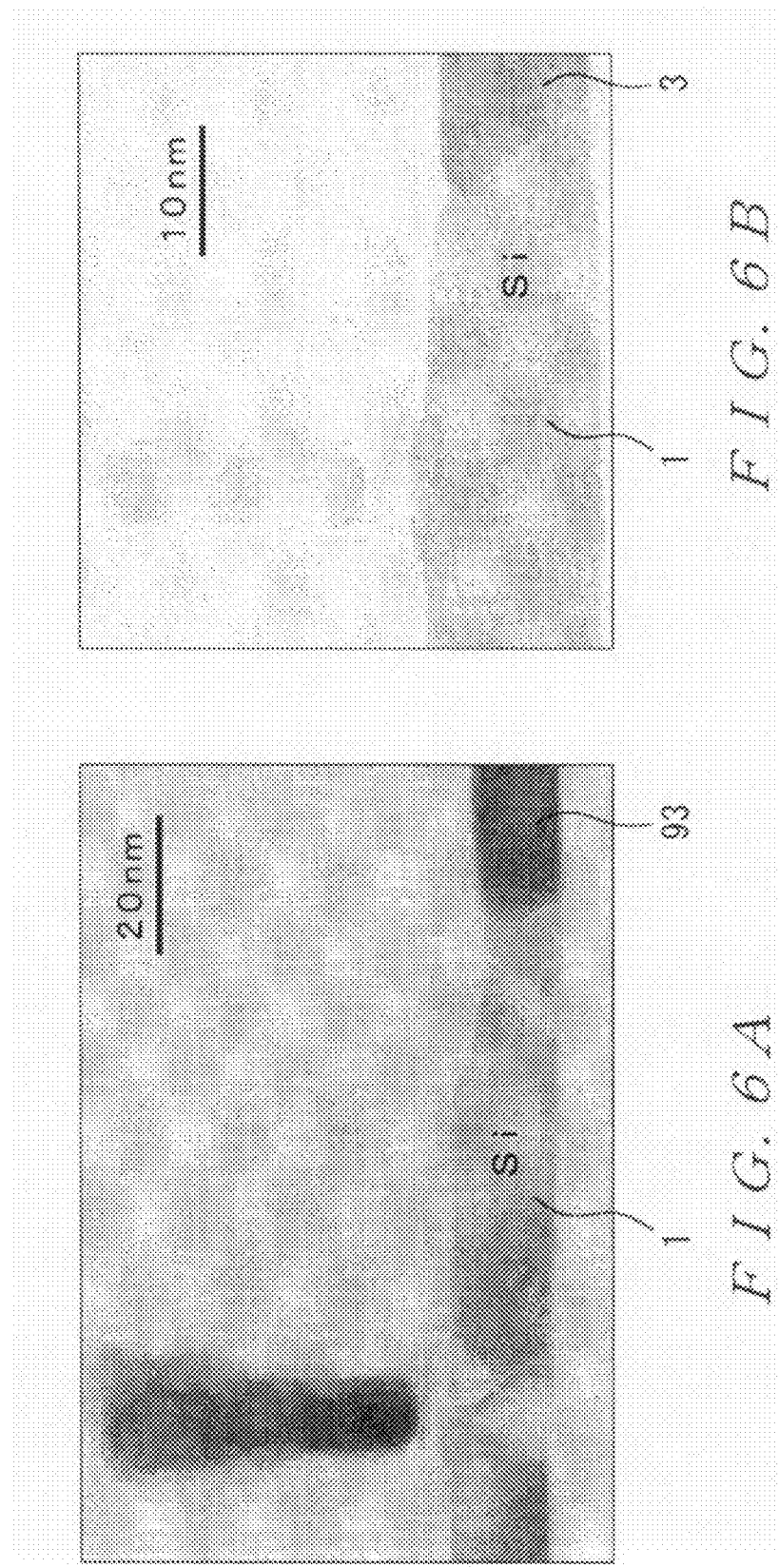

METHOD OF NICKEL DISILICIDE FORMATION AND METHOD OF NICKEL DISILICATE SOURCE/DRAIN FORMATION

The entire disclosure of Japanese Patent Application No. 2005-050416, filed Feb. 27, 2006, is expressly incorporated by reference herein.

BACKGROUND

1. Field of the Invention

The present invention relates to a method for forming a silicide and a method for fabricating a semiconductor device and, in particular, to a technique capable of forming at a low temperature a highly thermostable nickel disilicide ($NiSi_2$) layer having an edge the position of which is finely controllable.

2. Description of the Related Art

The gate lengths of today's field-effect transistors are reduced to submicron scale in order to facilitate denser and faster semiconductor integrated circuits. Also, the surface of the source/drain layers of miniaturized field-effect transistors is silicided in order to inhibit the resistance of the source/drain layer from increasing. For example, Nitrogen-doped nickel monoSilicide technique for deep submicron CMOS salicide, IEDM 1995, pp. 453-456 (hereinafter referred to as Non-Patent Document 1) discloses a technique for applying nickel monosilicide (NiSi) that can be formed by annealing at low temperatures on the order of 400° C. to a CMOS.

SUMMARY

Application of NiSi disclosed in Non-Patent Document 1 to a CMOS poses the following problems. A first problem is that a NiSi thin film is difficult to form flat and its edge positions cannot precisely be controlled. The term "edge position" here refers to the position of the edge on the channel region side of a source/drain layer or the position of the edge of a substrate in the depth direction (namely the bottom surface). A second problem is that the NiSi is easily affected by heat and can be partially changed to nickel disilicide ($NiSi_2$) by annealing at high temperatures.

To solve the first and second problems, a method described in Low-Temperature Formation of Epitaxial NiSi2 Layers with Solid-Phase Reaction in Ni/Ti/Si (001) Systems, Japanese Journal of Applied Physics Vol. 44, No. 5A, 2005, pp. 2945-2947 (herein after referred to as Non-Patent Document 2), for example, may be used. Non-Patent Document 2 discloses a technique for forming a thermostable nickel disilicide ($NiSi_2$) layer having a finely controllable edge position as compared with a NiSi layer. However, the technique involves heat treatment at 800° C. or higher to form $NiSi_2$ having a flat interface. The technique therefore has a problem that the concentration distribution of an impurity in a substrate can change during a process of forming $NiSi_2$ and is difficult to apply to semiconductor fabricating processes.

The present invention has been made in view of these circumstances and an object of the present invention is to provide a silicide forming method and a fabricating method of a semiconductor device capable of forming at a low temperature a highly thermostable $NiSi_2$ having an edge the position of which is finely controllable.

First Aspect of the Invention

In order to achieve the object, a silicide forming method according to a first aspect of the present invention includes the steps of: forming a nickel film on a silicon layer (or a silicon substrate); introducing nitrogen into at least one of the nickel film and the interface between the nickel film and the silicon layer (or the silicon substrate); and after the introduction of the nitrogen, applying heat treatment to the nickel film and the silicon layer (or the silicon substrate) under predetermined conditions to form a nickel disilicide layer.

With this configuration a nickel disilicide ($NiSi_2$) that is highly thermostable and has an edge the position of which is finely controllable can be formed at a temperature lower than that in the technique described in Non-Patent Document 2.

Second Aspect of the Invention

A method for forming a silicide according to a second aspect of the present invention includes the steps of: forming a nickel film on a silicon layer (or a silicon substrate); and applying heat treatment to the nickel film and the silicon layer (or the silicon substrate) under predetermined conditions to form a nickel disilicide layer; wherein the step of forming the nickel film forms the nickel film on the silicon layer (or the silicon substrate) by sputtering the nickel film in an atmosphere of a gas mixture including argon and nitrogen gases.

With this configuration, a nickel film containing nitrogen can be formed on a silicon layer (or silicon substrate) Therefore, a nickel disilicide ($NiSi_2$) that is highly thermostable and has an edge the position of which is finely controllable can be formed at a temperature lower than that in the technique described in Non-Patent Document 2.

Third Aspect of the Invention

A method for forming silicide according to a third aspect of the present invention is that the partial pressure ratio of the nitrogen gas in the gas mixture in the second aspect of the invention is at least 5%. Generally, the content of nitrogen in a nickel film tends to increase as the partial pressure of nitrogen in a mixture gas increases.

Therefore, nitrogen can be efficiently introduced into the nickel film.

Fourth Aspect of the Invention

A method for forming silicide according to a fourth aspect of the present invention includes the steps of: forming a nickel film on a silicon layer (or a silicon substrate); introducing nitrogen into the nickel film by ion implantation; and after the ion implantation of the nitrogen, applying heat treatment to the nickel film and the silicon layer (or the silicon substrate) under predetermined conditions to form a nickel disilicide layer.

With this configuration, nitrogen can be introduced into at least one of the nickel film and the interface between the nickel film and the silicon layer (or the silicon substrate). Therefore, a nickel disilicide ($NiSi_2$) that is highly thermostable and has an edge the position of which is finely controllable can be formed at a temperature lower than that in the technique described in Non-Patent Document 2.

Fifth Aspect of the Invention

A method for forming silicide according to a fifth aspect of the present invention includes the steps of: forming a silicon nitride film on a silicon layer (or a silicon substrate); forming a nickel film on the silicon nitride film; and applying heat treatment to the nickel film and the silicon nitride film and silicon layer (or the silicon substrate) under predetermined conditions to form a nickel disilicide layer.

With this configuration, nitrogen is supplied from the silicon nitride film to the nickel film and the silicon layer (or silicon substrate). Therefore, nickel disilicide ($NiSi_2$) that is highly thermostable and has an edge the position of which is finely controllable can be formed at a temperature lower than that in the technique described in Non-Patent Document 2.

Sixth Aspect of the Invention

In a sixth aspect of the present invention, the method for forming silicide according to any one of the first to fifth aspects of the invention includes the step of, prior to forming the nickel film, applying plasma processing to the surface of the silicon layer (or the silicon substrate) in an atmosphere including hydrogen gas.

With this configuration, the surface of the silicon layer (or silicon substrate) is hydrogen-terminated. Accordingly, the interface state between the silicon layer (or silicon substrate) and the nickel film can be reduced.

Seventh Aspect of the Invention

In a seventh aspect of the invention, the method for forming a silicide according to any one of the first to sixth aspects of the invention includes the step of, prior to forming the nickel disilicide layer, forming on the nickel film a cap film which inhibits diffusion of nitrogen from inside of the nickel film to the outside, wherein the step of forming the nickel disilicide layer applies heat treatment to the nickel film covered with the cap film and the silicon layer (or the silicon substrate) under predetermined conditions to form the nickel disilicide layer.

With this configuration, when a nickel disilicide layer is formed by heat treatment, diffusion of nitrogen from inside of the nickel film to the outside (that is, the chamber) can be inhibited by the cap film and therefore the nickel disilicide layer can be efficiently formed.

Eighth Aspect of the Invention

According to an eighth aspect of the invention, the predetermined conditions in the method for forming silicide according to any one of the first to seventh aspects of the invention are that the pressure in a chamber in which the heat treatment is performed is atmospheric pressure and the temperature in the chamber is in the range from 400° C. (including) to 800° C. (excluding).

Here, the atmospheric pressure is the pressure of atmosphere in the chamber not pressurized or depressurized, which is approximately 1 atmosphere (1,013 hPa). By setting the conditions (predetermined conditions) under which the heat treatment is performed for forming the nickel disilicide layer to values in the range given above, the nickel disilicide layer can be efficiently formed.

Ninth Aspect of the Invention

According to a ninth aspect of the invention, the predetermined conditions in the method for forming silicide according to any one of the first to seventh aspects of the invention are that the pressure in a chamber in which the heat treatment is performed is atmospheric pressure and the temperature in the chamber is in the range from 500° C. (including) to 600° C. (including). By setting the conditions under which the heat treatment is performed for forming the nickel disilicide layer to values in the range given above, the nickel disilicide layer can be formed more efficiently than under the conditions in the eighth aspect of the invention.

Tenth Aspect of the Invention

A method for fabricating a semiconductor device according to a tenth aspect of the invention includes the steps of: forming a gate electrode on a silicon layer; forming a source/drain layer including a nickel disilicide layer joined with a channel region of the silicon layer; introducing an impurity to the nickel disilicide layer; and driving a part of the impurity introduced in the nickel disilicide layer into the silicon layer to form an impurity-doped layer at the interface between the nickel disilicide layer and the silicon layer, wherein the nickel disilicide layer is formed by performing the method for forming silicide according to the any one of first to ninth aspects of the invention.

Because one of the methods for forming silicide according to any one of the first to ninth aspects of the invention is used, a nickel disilicide layer that is highly thermostable and has an edge the position of which is finely controllable can be formed at a low temperature.

Furthermore, the impurity-doped layer can be formed and self-aligned along the interface between the nickel disilicide layer and the silicon layer because the impurity driven out of the nickel disilicide layer is diffused into the silicon layer. Therefore, even if the nickel disilicide layer is formed in such a manner that its bottom is in contact with an insulating layer, the nickel disilicide layer can be prevented from contacting with a channel region of the silicon layer. Accordingly, the resistance of the source/drain layer can be reduced while suppressing junction leakage. Because the impurity is diffused into the silicon layer through the nickel disilicide layer, the temperature required for introducing the impurity into the silicon layer can be decreased and damage to a metal gate or a high dielectric insulating film can be suppressed. In addition, the need for directly applying ion implantation in order to introduce the impurity into silicon layer can be eliminated and therefore the possibility of occurrence of crystal defects in the channel region can be reduced.

Eleventh Aspect of the Invention

A method for fabricating a semiconductor device according to an eleventh aspect of the invention includes the steps of: forming a dummy gate electrode on a silicon layer; forming a source/drain layer including a nickel disilicide layer joined with a channel region of the silicon layer; introducing an impurity into the nickel disilicide layer; driving a part of the impurity introduced in the nickel disilicide layer into the silicon layer to form an impurity-doped layer at the interface between the nickel disilicide layer and the silicon layer; forming on the silicon layer an insulating layer in which the dummy gate electrode is embedded; removing the dummy gate electrode embedded in the insulating layer to form a trench conformal to the dummy gate electrode in the insulating layer; and embedding a gate electrode in the trench; wherein the nickel disilicide layer is formed by performing the method for forming silicide according to any one of the first to ninth aspects of the invention.

With this configuration, because the method for forming silicide according to any one of the first to ninth aspects is applied, a nickel disilicide layer that is highly thermostable and has an edge the position of which is finely controllable can be formed at a low temperature.

Furthermore, a gate electrode can be formed after formation of an impurity-doped layer while maintaining self-alignment of the position of the gate electrode to the impurity-doped layer. Therefore, the gate electrode can be prevented from being exposed to the thermal load required for forming layers such as the impurity-doped layer, and the gate electrode can be readily metalized.

Twelfth Aspect of the Invention

A method for fabricating a semiconductor device according to a twelfth aspect of the invention includes the steps of: forming a gate electrode on a silicon layer disposed on an insulating layer; forming a sidewall on a side surface of the gate electrode; forming a nickel disilicide layer laterally to the sidewall; introducing an impurity into the nickel disilicide layer; and applying heat treatment to bring the bottom surface of the nickel disilicide layer into contact with the insulating layer to form from the nickel disilicide layer a source/drain layer a junction of which exists along a crystal orientation plane of the silicon layer, and to diffuse a part of the impurity introduced in the nickel disilicide layer into the silicon layer to form an impurity-doped layer at the interface between the source/drain layer and the silicon layer: wherein the nickel disilicide layer is formed by performing the method for forming silicide according to any one of the first to ninth aspects of the invention.

With this configuration, because the method for forming silicide according to any one of the first to ninth aspects of the invention is applied, a nickel disilicide layer that is highly thermostable and has an edge the position of which is finely controllable can be formed at a low temperature.

Furthermore, a source/drain layer can be formed in the nickel disilicide layer that extends the full depth of the silicon layer while extending the channel region in its depth direction. Also, part of impurity driven out of the nickel disilicide layer can be diffused into the silicon layer to form impurity-doped layers which are self aligned along the interface between the nickel disilicide layer and the silicon layer. Therefore, even if the nickel disilicide layer is formed in such a manner that its bottom is in contact with the insulating layer, the nickel disilicide layer can be prevented from contacting the silicon layer from which the channel region is formed. Thus, the resistance of the source/drain layer can be reduced while suppressing junction leakage, and an energy barrier in a deep region of the channel where the effect of the gate electrode cannot reach can be increased to suppress a short channel effect.

Thirteenth Aspect of the Invention

A method for fabricating a semiconductor device according to a thirteenth aspect of the invention includes the steps of: forming a gate electrode on a silicon substrate; forming a sidewall on a side surface of the gate electrode; forming a nickel disilicide layer laterally to the sidewall; introducing an impurity into the nickel disilicide layer; forming from the nickel disilicide layer a source/drain layer whose junction with a channel region exists along a crystal orientation plane of the silicon substrate by heat treatment, and diffusing a part of impurity introduced into the nickel disilicide layer into the silicon substrate to form an impurity-doped layer at the interface between the source/drain layer and the silicon substrate; wherein the nickel disilicide layer is formed by performing the method for forming silicide according to any one of the first to ninth aspects of the invention.

With this configuration, because one of the methods for forming silicide according to the first to ninth aspects of the invention is applied, a nickel disilicide layer that is highly thermostable and has an edge the position of which is finely controllable can be formed at a low temperature.

Furthermore, the nickel disilicide layer forming the source/drain layer can be made thick while the channel region is extended in the depth direction. In addition, the impurity driven out of the nickel disilicide layer can be diffused into the silicon substrate to form an impurity-doped layer which is self-aligned along the interface between the nickel disilicide layer and the silicon substrate. Therefore, if the nickel disilicide layer is thick, the nickel disilicide layer can be prevented from contacting the channel region of the silicon substrate. Thus, the resistance of the source/drain layer can be reduced while suppressing junction leakage, and an energy barrier in a deep region of the channel where the effect of the gate electrode cannot reach can be increased to suppress a short channel effect.

BRIEF DESCRIPTION OF THEE DRAWINGS

FIGS. 5A to 5C show a set (1) of photographs for comparison between NiSi and $NiSi_2$;

FIGS. 6A and 6B show a set (2) of photographs for comparison between NiSi and $NiSi_2$;

Figure 12:
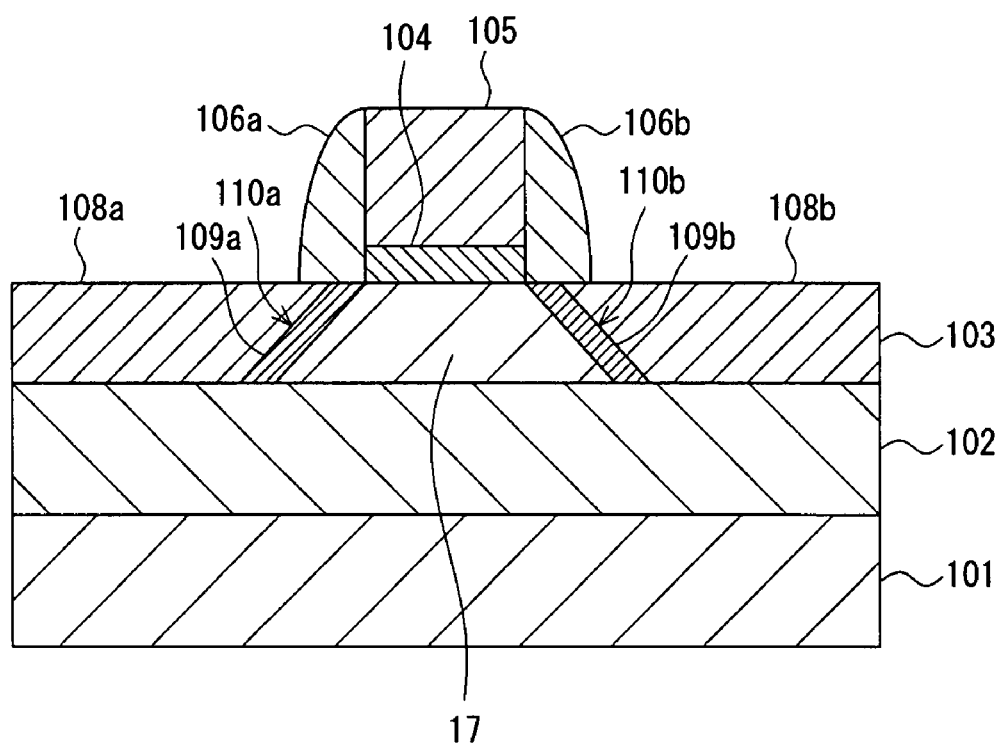
Figure 14A:
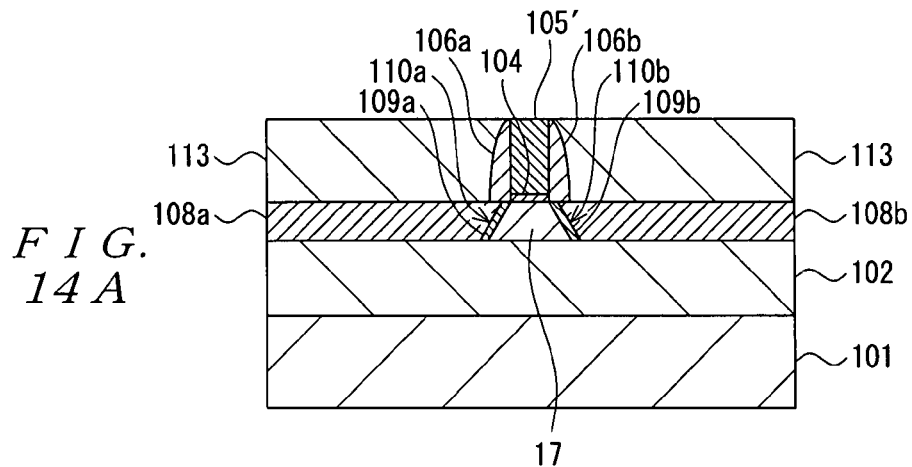
Figure 14B:
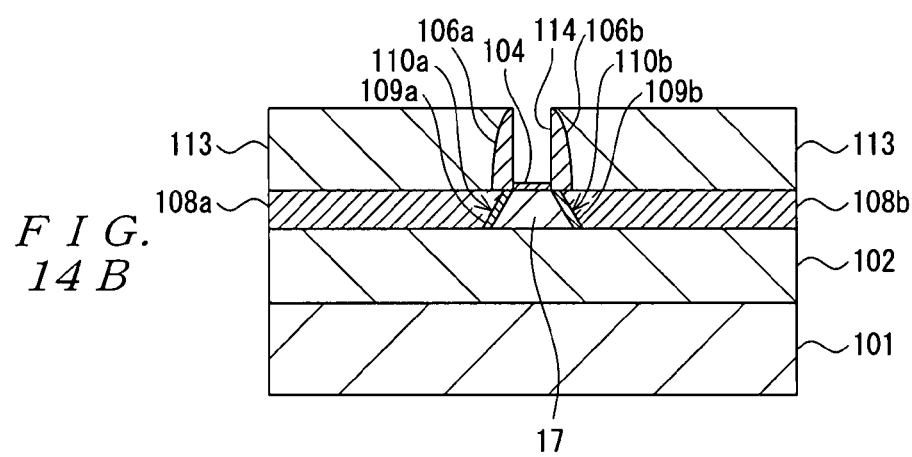
Figure 14C:
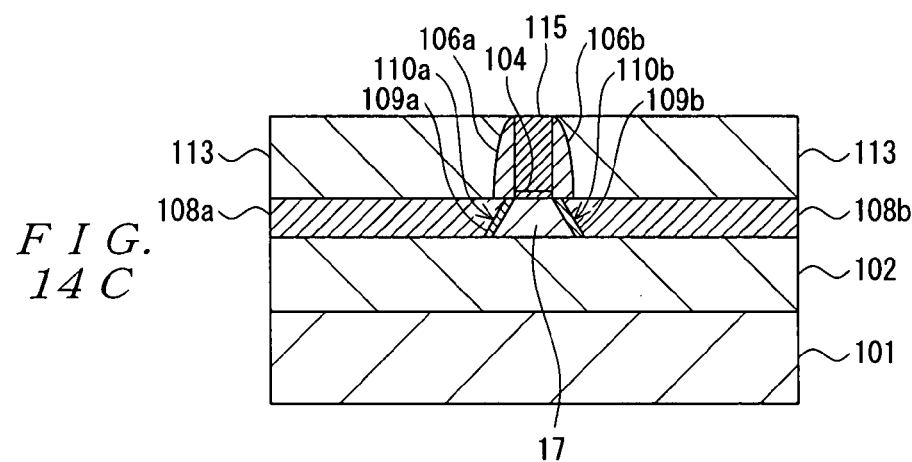
Figure 15:
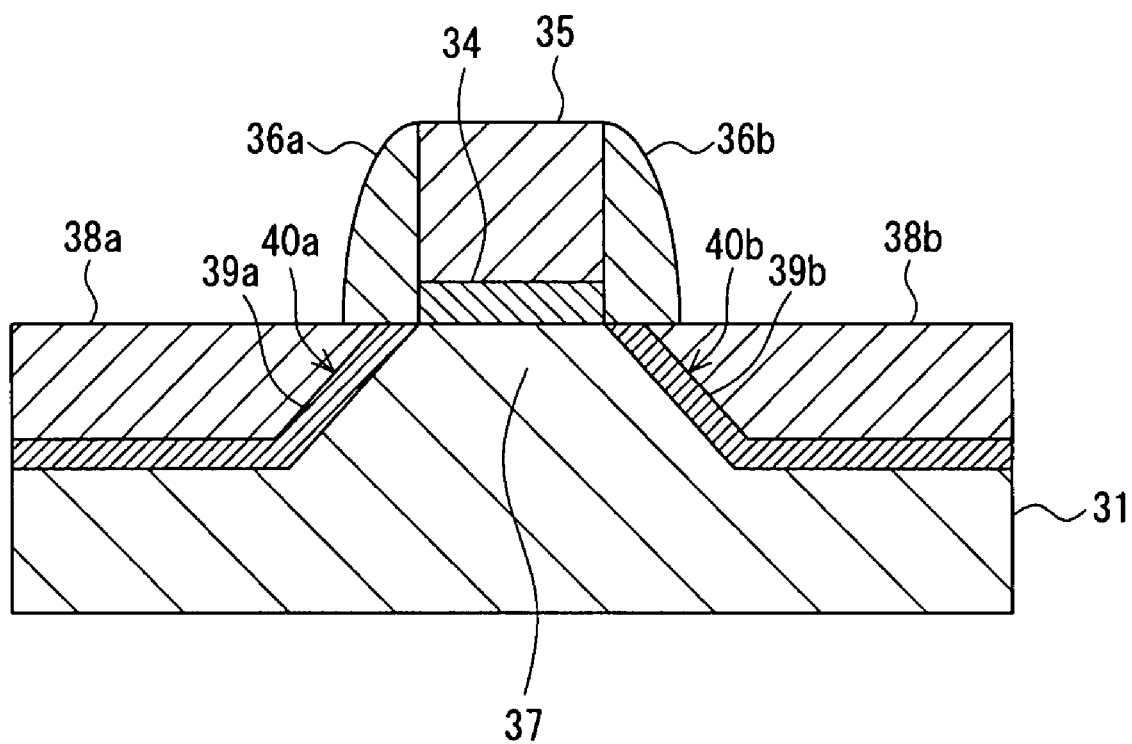

FIG. 12 schematically shows a configuration of a semiconductor device according to a sixth embodiment;

FIGS. 13A to 13E illustrate an exemplary method for fabricating the semiconductor device according to the sixth embodiment;

FIGS. 14A to 14C illustrate a method for fabricating a semiconductor device according to a seventh embodiment; and FIG. 15 schematically shows a configuration of a semiconductor device according to an eighth embodiment.

DETAILED DESCRIPTION OF THE PREFERRED EMBODIMENTS

Embodiments of the present invention will be described with reference to the accompanying drawings.

(1) First Embodiment

Figure 1:
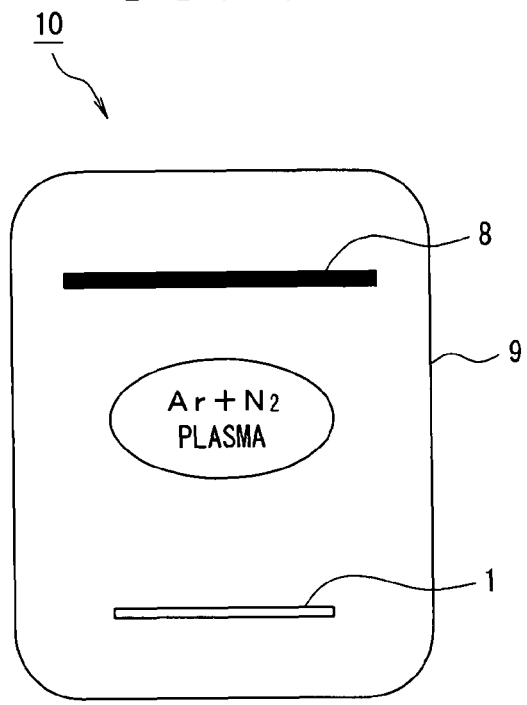
FIG. 1 illustrates a method (part 1) for forming $NiSi_2$ according to a first embodiment.

FIG. 1 is a conceptual diagram showing a method for forming nickel disilicide ($NiSi_2$) according to a first embodiment of the present invention.

As shown in FIG. 1, a spattering system 10 having a chamber 9 capable of producing a high vacuum is first provided and a nickel (Ni) target 8 is placed in the spattering system 10. Then, a wafer 1 is disposed at a position opposed to the Ni target 8 in the chamber 9 evacuated to a high degree of vacuum and a gas mixture of argon (Ar) and nitrogen ($N_2$) gasses is introduced in the chamber 9.

The wafer 1 may bean SOI substrate or a bulk silicon substrate, on which elements such as gate electrodes and source/drain layer of MOS transistors are formed. The degree of the high vacuum generated in the chamber 9 is in the range of approximately $1 \times 10^{-4}$ to $1 \times 10^{-6}$ Pa, for example. The ratio of the $N_2$ gas in the gas mixture (i.e. the partial pressure ratio) is for example in the range from 5% (including) to 50% (including), preferably in the range from 10% (including) to 20% (including).

A high electric field, for example, is applied to the gas mixture to form a plasma and a Ni film is formed on the surface of the wafer 1 by sputtering in the plasma. In particular, the Ni target 8 is bombarded by argon ions ($Ar^+$) in the chamber 9 and Ni atoms released by the recoil is deposited on the surface of the wafer 1 to form a Ni film. In doing this, part of the nitrogen in the chamber 9 is carried to the surface of the wafer 1 together with Ni atoms and is contained in the Ni film.

That is, a Ni film containing N atoms is formed on the surface of the wafer 1. The thickness of the Ni film is approximately 1 to 30 nm, for example.

Figure 2:
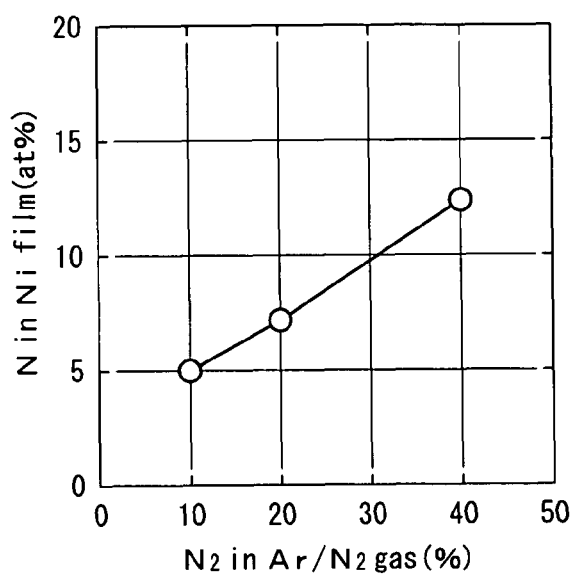
FIG. 2 shows the relationship between the partial pressure ratio of $N_2$ and the percentage of content of N atoms in a Ni film.

FIG. 2 shows the relationship between the partial pressure ratio of $N_2$ and the percentage of content of N atoms in a Ni film. The horizontal axis of the graph in FIG. 2 represents the percentage of the $N_2$ gas (%) content in the gas mixture ($Ar/N_2$), the vertical axis represents the percentage of content of N atoms (at %) in the Ni film formed on a bulk silicon substrate. It can be seen that the Ni film formed by sputtering contains approximately 5 to 8 at % N atoms when the partial pressure ratio of $N_2$ in the gas mixture is in the range of 10 to 20% as mentioned above.

Figure 3A:
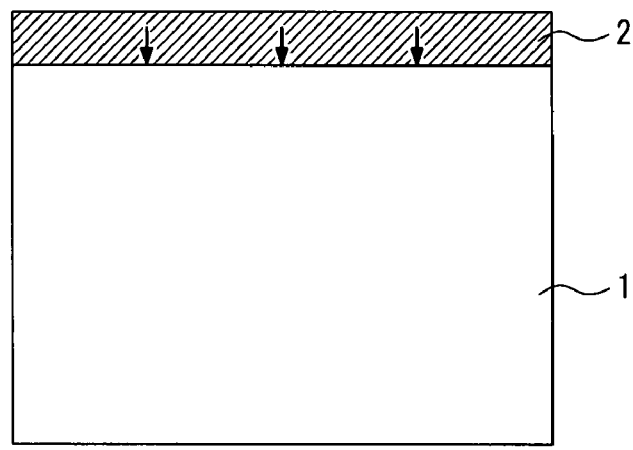
FIGS. 3A and 3B illustrate a method (part 2) for forming $NiSi_2$ according to the first embodiment.
Figure 3B:
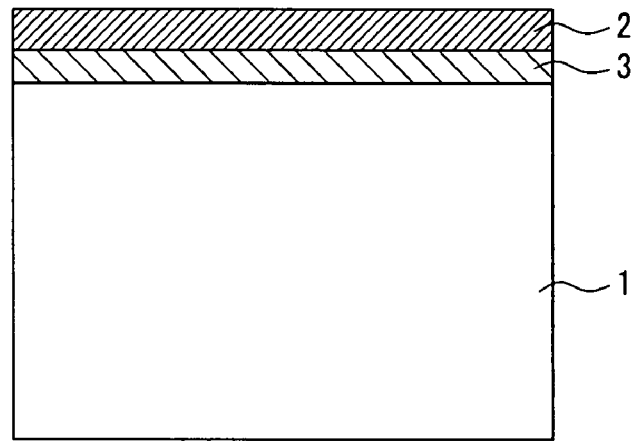

Then, the wafer 1 on which the Ni film 2 is formed is annealed as shown in FIG. 3A. The annealing diffuses at least part of the N atoms contained in the Ni film 2 toward the interface between the Ni film 2 and the wafer 1 as indicated by the arrows in FIG. 3A. As a result, a Ni $Si_2$ layer 3 is formed as shown in FIG. 3B.

The inventor conducted experiments and concluded from the results that the mechanism of formation of the $NiSi_2$ layer is possibly as follows: N atoms that arrived at the interface of the wafer 1 combines with Si on the surface of the wafer 1 to form an imaginary barrier film, which temporarily suppresses the diffusion of Ni into Si. This facilitates silicide reaction in the Si-rich composition and, as a result, the $NiSi_2$ layer is formed. (This is just the inventor's view.)

In the present invention, the annealing may be conducted in the chamber 9 of the sputtering system 10 shown in FIG. 1 or may be conducted in a chamber (or furnace) of other system. The heat treatment conditions of the annealing are 100% $N_2$ atmosphere at atmospheric pressure (i.e. a pressure of approximately 1 atmosphere) and a temperature, in the range from 400° C. (including) to 800° C. (excluding), preferably from 500° C. (including) to 600° C. (including).

Figure 4:
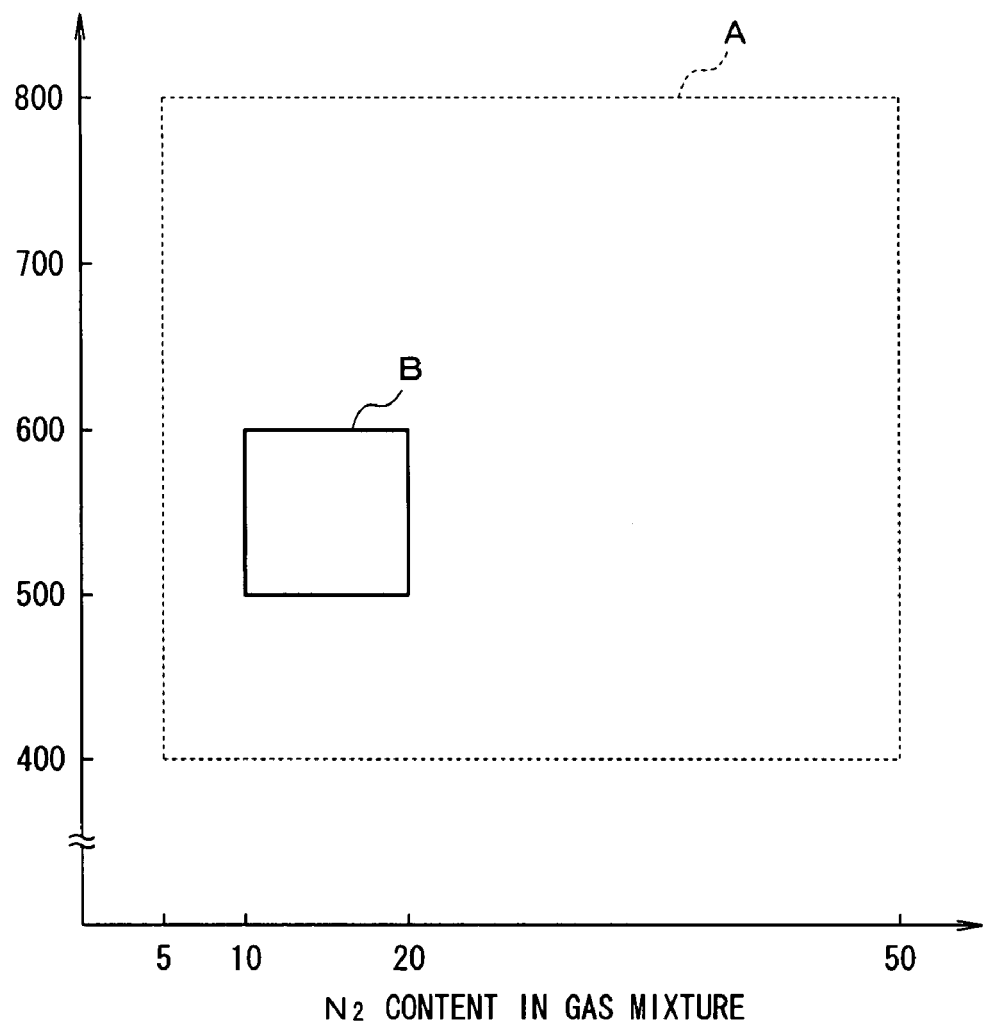
FIG. 4 shows a range of combinations of partial pressure ratios of $N_2$ in a chamber during sputtering of a Ni film and annealing temperatures during formation of $NiSi_2$.

FIG. 4 shows a range of combinations of partial pressure ratios of $N_2$ in the chamber for forming a Ni film by sputtering and annealing temperatures for forming $NiSi_2$. The horizontal axis of the graph in FIG. 4 represents the percentage of content of the $N_2$ gas in a mixture gas ($Ar/N_2$), and the vertical axis represents the annealing temperature. Experiments conducted by the inventor showed that $NiSi_2$ can be formed by setting the percentage of content of $N_2$ gas in the gas mixture used during sputtering and the annealing temperature after the sputtering to values within the range enclosed in dotted-line box A. The experiments also showed that $NiSi_2$ can be more efficiently formed by setting the percentage of content of $N_2$ gas and the annealing temperature to values within the range enclosed in the solid-line box B inside the dotted-line box A shown in FIG. 4.

Thus, according to the first embodiment of the present invention, a Ni film 2 containing nitrogen can be formed on a wafer 1. A highly thermostable $NiSi_2$ layer 3 having an edge the position of which is finely controllable can be formed by annealing the Ni film 2 containing nitrogen in a $N_2$ atmosphere (100%) at atmospheric pressure (i.e. a pressure of approximately 1 atmosphere) at a temperature in the range from 400° C. (including) to 800° C. (excluding), preferably 500° C. and over to 600° C. (including). Thus, the technique can form a $NiSi_2$ layer at low temperatures as compared to the technique described in Non-Patent Document 2.

The first embodiment has been described with respect to formation of a $NiSi_2$ layer 3 by annealing a wafer 1 after forming a Ni film 2 on the surface of the wafer 1 by sputtering. However, the Ni film 2 may be formed by spurting while annealing the wafer 1 in a plasma atmosphere of a gas mixture containing Ar and $N_2$ gases according to the present invention. This configuration also can form a $NiSi_2$ layer on the surface of a wafer 1.

The gas mixture introduced in the chamber 9 for sputtering a Ni film 2 may consist of Ar and ammonium ($NH_3$) gasses. N atoms can be supplied into the Ni film 2 by introducing the gas mixture containing $NH_3$ instead of $N_2$ in the chamber 9 to form a plasma and by sputtering a Ni film on the surface of a wafer 1 in the plasma atmosphere. Therefore, a $NiSi_2$ layer 3 can be formed by the subsequent annealing.

Comparison Between the Present Invention and Conventional Art

FIGS. 5A to 5C show photographs (set 1) for comparing a nickel monosilicide (NiSi) layer with a nickel disilicide ($NiSi_2$) layer.

The NiSi layer 93 shown in FIG. 5A was formed by introducing only Ar gas in a chamber (the content of $N_2$ gas is 0%) to sputter a Ni film (not shown) on a wafer 1 and by heat-treating the wafer 1 with the Ni film formed on it at a given temperature. The wafer 1 shown in FIG. 5A is a bulk silicon substrate with the surface orientation (100).

The $NiSi_2$ layer 3 shown in FIG. 5B was formed by introducing a gas mixture consisting of Ar and $N_2$ ($N_2$ gas content is 20%) in the chamber 9 to sputter a Ni film (not shown) on a wafer 1 and by heat-treating the wafer 1 with the Ni film formed on it at a given temperature. The wafer 1 shown in FIG. 5B is a bulk silicon substrate with the surface orientation (100).

The $NiSi_2$ layer 3 shown in FIG. 5C was formed by introducing a gas mixture consisting of Ar and $N_2$ ($N_2$ gas content is 20%) in the chamber 9 to sputter a Ni film (not shown) on a wafer 1 and by heat-treating the wafer 1 with the Ni film formed on it at a give temperature. The wafer 1 shown in FIG. 5C is a bulk silicon substrate with the surface orientation (111).

As can be seen from FIGS. 5A to 5C, the $NiSi_2$ layer 3 according to the present invention has a clearly defined bottom edge compared with the NiSi layer 93. This means that the edge position is finely controllable.

FIGS. 6A and 6B show photographs (set 2) for comparing a NiSi layer and a $NiSi_2$ layer. As can be seen from FIGS. 6A and 6B, the $NiSi_2$ layer 3 according to the present invention has a clearly defined edge on the channel region side compared with the NiSi layer 93. This means that the edge position is finely controllable.

Figure 7A:
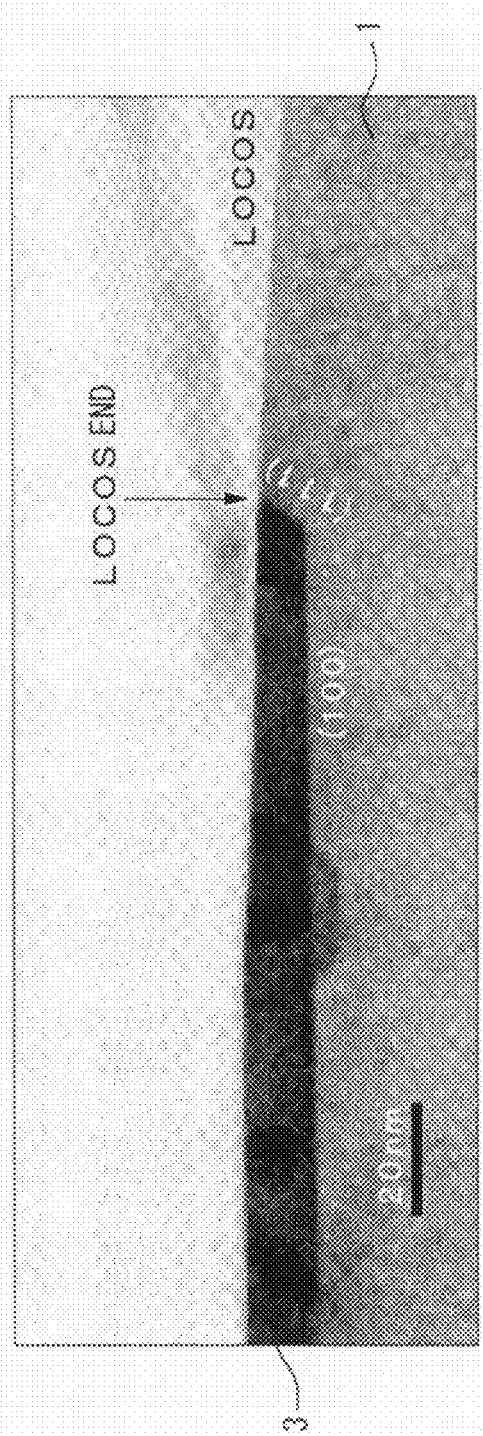
FIGS. 7A and 7B show a set (3) of photographs for comparison between NiSi a $NiSi_2$.
Figure 7B:
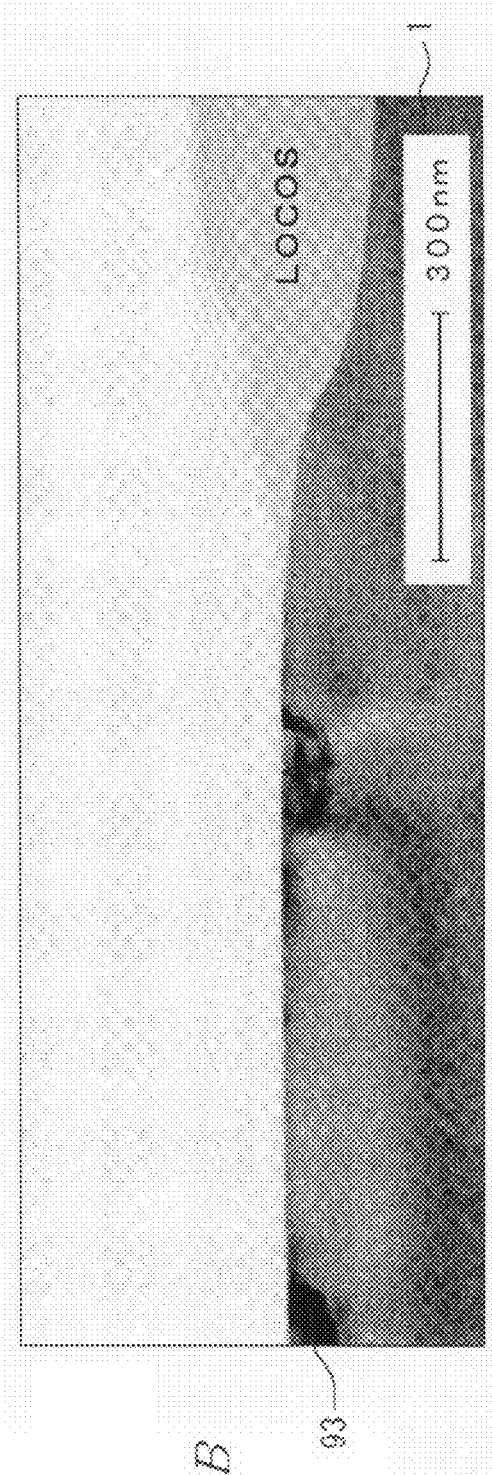

FIGS. 7A and 7B show photographs (Set 3) for comparing a NiSi layer and a $NiSi_2$ layer. As can be seen from FIGS. 7A and 7B, the $NiSi_2$ layer 3 according to the present invention has a broader region formed flat and, unlike the NiSi layer 93, there are almost no aggregates observed.

(2) Second Embodiment

Figure 8:
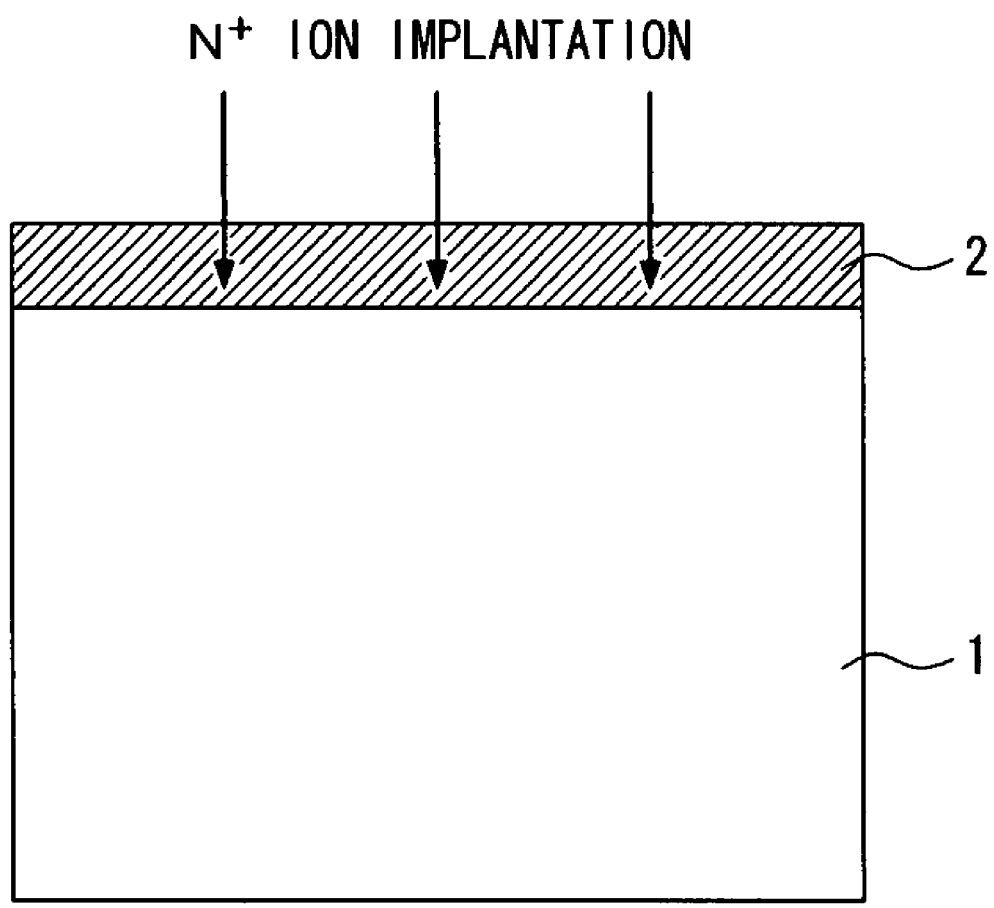
FIG. 8 illustrates a method for forming $NiSi_2$ according to a second embodiment.

FIG. 8 is a conceptual diagram illustrating a method for forming a nickel disilicide ($NiSi_2$) layer according to a second embodiment of the present invention.

In the second embodiment, first a sputtering system 10 is used to form a Ni film 2 on a wafer 1. The atmosphere in the chamber 9 used for the sputtering may be a gas mixture consisting of Ar and $N_2$ gases as in the first embodiment, or, differently from the first embodiment, may be Ar gas alone. The wafer 1 on which the Ni film 2 is formed is unloaded from sputtering system 10 and placed in an ion implanter.

Then, nitrogen ions ($N^+$) are implanted in the Ni film 2 formed on the wafer 1, as shown in FIG. 8. Ion implantation conditions are adjusted so that the peak of N content falls in a region from near the center of the thickness of the Ni film 2 to the interface between the Ni film 2 and the wafer 1. After N⁺ ion implantation, the wafer 1 is unloaded from the ion implanter. Then the wafer 1 is annealed under conditions similar to those in the first embodiment.

That is, the annealing conditions may be as follows: in an $N_2$ atmosphere (100%) at atmospheric pressure (i.e. a pressure of approximately 1 atmosphere) at a temperature in the range from 400° C. (including) to 800° C. (excluding), preferably in the range from 500° C. (including) to 600° C. (including). By the annealing, apart of the nitrogen ions N⁺ implanted in the Ni film 2 diffuse to the interface between the Ni film 2 and the wafer 1 to form a $NiSi_2$ layer.

Thus, according to the second embodiment of the present invention, a highly thermostable $NiSi_2$ layer having an edge the position of which is finely controllable can be formed at a lower temperature by directly introducing N⁺ into the Ni film 2 and the interface between the Ni film 2 and the wafer 1 as compared with the technique described in Non-Patent Document 2.

While the second embodiment has been described with respect to formation of Ni film 2 by sputtering, the method for forming Ni film 2 is not limited to this and the Ni film 2 may be formed by using other method such as vapor deposition or CVD.

(3) Third Embodiment

Figure 9A:
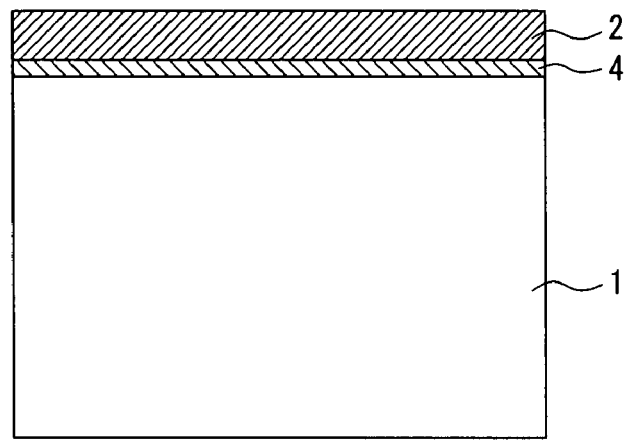
FIGS. 9A and 9B illustrate a method for forming $NiSi_2$ according to a third embodiment.
Figure 9B:
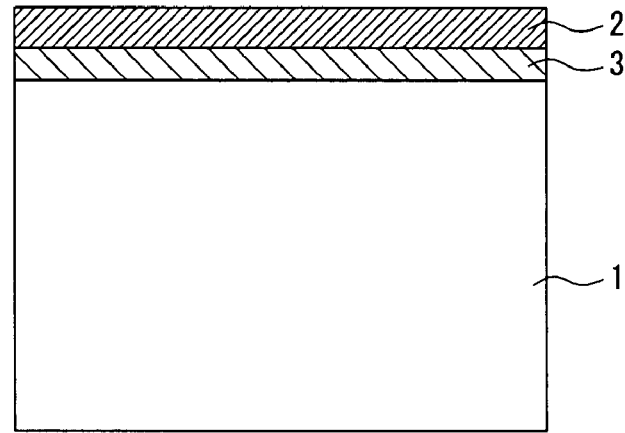

FIGS. 9A and 9B are conceptual diagram illustrating a method for forming a nickel disilicide ($NiSi_2$) layer according to a third embodiment of the present invention.

As shown in FIG. 9A, an ultra-thin silicon nitride (SiN) film 4 is formed on a wafer 1 before forming a Ni film 2. The term "ultra-thin" refers to a thickness on the order of 5 to 10 Å. The SiN film 4 is formed using CVD, for example.

Then, a sputtering system 10 is used to form a Ni film 2 on the SiN film 4. The atmosphere in the chamber used for sputtering the Ni film 2 may be a gas mixture consisting of Ar and $N_2$ gases as in the first embodiment, or, differently from the first embodiment, may be Ar gas alone. The method for forming Ni film 2 is not limited to the one described above. For example, CVD methods may be used.

That is, the wafer 1 is then annealed under conditions similar to those in the first embodiment.

The annealing conditions may be as follows: in an $N_2$ atmosphere (100%) at atmospheric pressure (i.e. a pressure of approximately 1 atmosphere) at a temperature in the range from 400° C. (including) to 800° C. (excluding), preferably in the range from 500° C. (including) to 600° C. (including). As a result, a $NiSi_2$ layer is formed on the wafer 1 as shown in FIG. 9B.

Thus, according to the silicide formation method according to the third embodiment of the present invention, nitrogen is supplied from the SiN film 4 to the Ni film 2 and the wafer 1. Therefore, a highly thermostable $NiSi_2$ layer 3 having an edge the position of which is finely controllable can be formed at lower temperatures than those in the technique described in Non-Patent Document 2.

It should be noted that a $NiSi_2$ film can be formed by using a silicon oxide (SiO) film instead of SiN in the third embodiment.

(4) Fourth Embodiment

Figure 10:
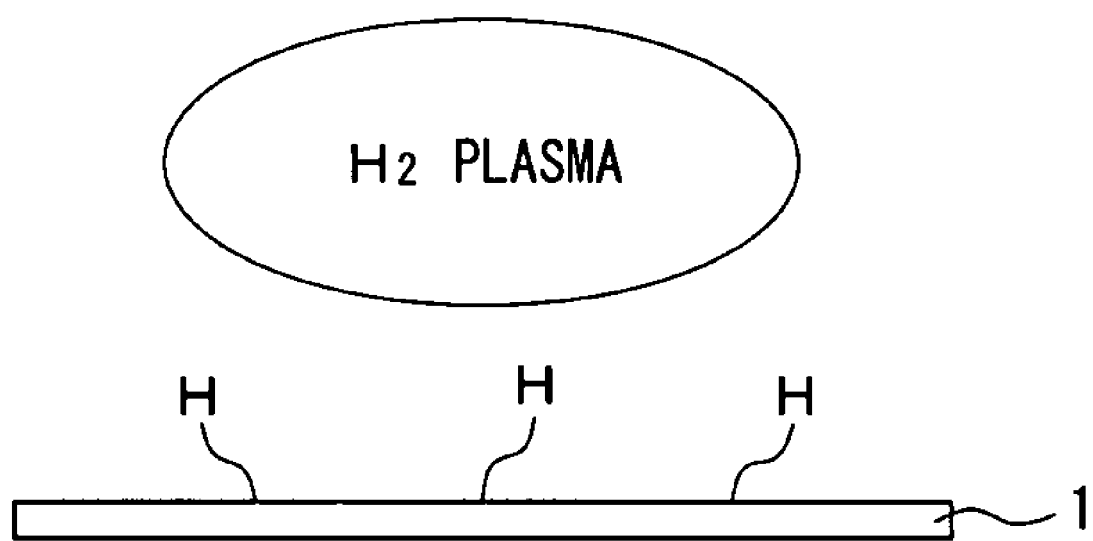
FIG. 10 illustrates a method for forming $NiSi_2$ according to a fourth embodiment.

FIG. 10 is a conceptual diagram illustrating a method for forming a nickel disilicide ($NiSi_2$) layer according to a fourth embodiment of the present invention.

According to the fourth embodiment, the surface of a wafer 1 is subjected to plasma processing in a hydrogen ($H_2$) atmosphere before sputtering a Ni film 2 on the wafer 1 as shown in FIG. 10 in the first embodiment. The $H_2$ plasma processing may be performed in a chamber 9 as shown in FIG. 1 or may be performed in a chamber (or furnace) of a system other than the sputtering system 10. In either case, the surface of the wafer 1 is hydrogen-terminated and therefore the conditions of the interface between the Ni film 2 and the surface of the wafer 1 can be stabilized. If the sputtering of the Ni film 2 is performed in the chamber 9 shown in FIG. 1 immediately after the H2 plasma processing (that is, in-Situ $H_2$ plasma processing is performed before sputtering the Ni film), the wafer is not exposed to the atmosphere and therefore the conditions of the interface are more stabilized.

The $H_2$ plasma processing can be applied to the second and third embodiments as well. That is, $H_2$ plasma processing can be performed immediately before forming the Ni film 2 in any of the second and third embodiments, thereby stabilizing the conditions of the interface between the Ni film 2 and the surface of the wafer 1.

(5) Fifth Embodiment

Figure 11A:
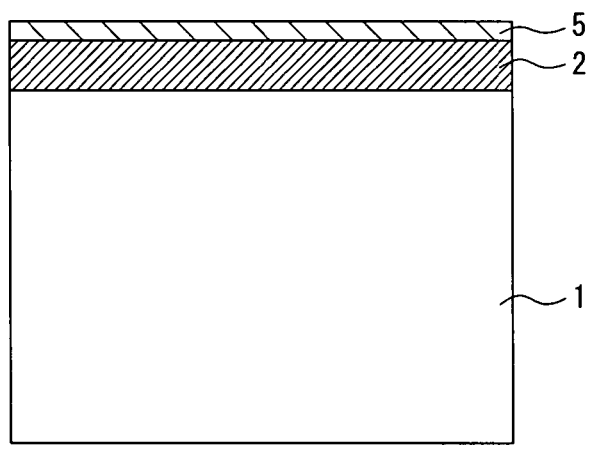
FIGS. 11A and 11B illustrate a method for forming $NiSi_2$ according to a fifth embodiment.
Figure 11B:
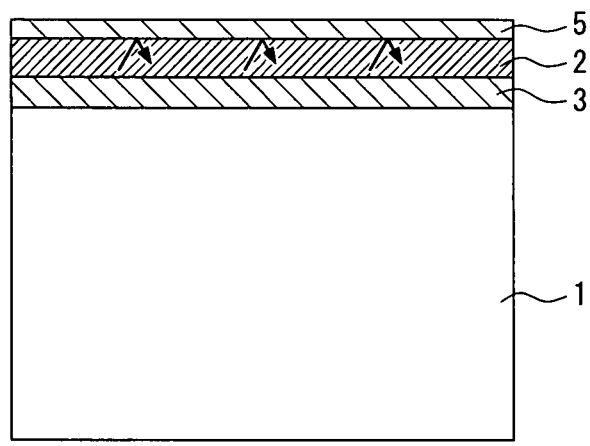

FIGS. 11A and 11B are conceptual diagram illustrating a method for forming a nickel disilicide ($NiSi_2$) layer according to a fifth embodiment of the present invention.

According to the fifth embodiment, after a Ni film 2 is formed by sputtering as described with respect to the first embodiment, a cap film 5 is formed on the Ni film 2 as shown in FIG. 11A. The cap film 5 may be a titanium nitride (TiN) film. With this structure, diffusion of nitrogen from inside of the Ni film to the outside (namely into the chamber) during annealing can be prevented by the cap film 5 as shown by the solid arrows in FIG. 11B. Accordingly, the $NiSi_2$ layer 3 can be formed efficiently.

Formation of the cap film 5 is applicable to the second and third embodiments as well. After the Ni film 2 is formed according to one of the second and third embodiments, a cap film 5 is formed on the Ni film 2. This can prevent diffusion of nitrogen from inside of the Ni film 2 to the outside.

(6) Sixth Embodiment

FIG. 12 is a cross-sectional view schematically showing a configuration of a semiconductor device according to a sixth embodiment of the present invention.

In FIG. 12, an insulating layer 102 is formed on an underlying substrate 101 and a single-crystal Si layer 103 is formed on the insulating layer 102. The underlying substrate 101 may be a substrate made of a semiconductor such as Si, Ge, SiGe, GaAs, InP, GaP, GaN, or SiC, or may be an insulator substrate made of an insulating material such as glass, sapphire, or ceramic. The insulating layer 102 may be an insulating layer or a buried insulator film of $SiO_2$, SiON, or $Si_3N_4$.

The SOI substrate composed of the underlying substrate 101, the insulating layer 102, and the Si layer 103 is fabricated by using a SIMOX (Separation by Implanted Oxygen) method or a bonding method.

As shown in FIG. 12, a gate electrode 105 is provided on the Si layer 103 with a gate insulating film 104 between them. The gate insulating film 104 may be made from $SiO_2$ or other dielectric such as $HfO_2$, HfON, HfAlO, HfAlON, HfSiO, HfSiON, $ZrO_2$, ZrON, ZrAlO, ZrAlON, ZrSiO, ZrSiON, $Ta_2O_5$, $Y_2O_3$, $(Sr, Ba)TiO_3$, $LaAlO_3$, $SrBi_2Ta_2O_9$, $Bi_4Ti_3O_{12}$, or $Pb(Zi, Ti)O_3$. The gate electrode 105 may be made from a polysilicon or a metal such as TaN, TiN, W, Pt, or Cu. The gate length of the gate electrode 105 is preferably less than or equal to 100 nm.

A sidewall 106a is formed on one side surface of the gate electrode 105 and a sidewall 106b is formed on the other side surface of the gate electrode 105. A source layer 108a whose bottom is in contact with the insulating layer 102 is provided on one side of the gate electrode 105. The source layer 108a is made from nickel disilicide ($NiSi_2$) and a junction with a channel region 17 is formed along a crystal orientation plane 110a of the Si layer 103. Provided on the other side of the gate electrode 105 is a drain layer 108b whose bottom is in contact with the insulating layer 102. The drain layer 108b is made of $NiSi_2$ and a junction with the channel region 17 is formed along a crystal orientation plane 110b of the Si layer 103. The crystal orientation planes 110a, 110b may be the (111) plane of the Si layer 103.

An impurity-doped layer 109a is formed at the interface between $NiSi_2$ of the source layer 108a and the Si layer 103 in such a manner that the impurity-doped layer 109a self-aligns along the crystal orientation plane 110a. Also, an impurity-doped layer 109b is formed at the interface between $NiSi_2$ of the drain layer 108b and the Si layer 103 in such a manner that the impurity-doped layer 109b self-aligns along the crystal orientation surface 110b. The impurity-doped layers 109a, 109b can be doped heavily enough to prevent energy barriers from being formed between the impurity-doped layers 109a, 109 and the $NiSi_2$ of the source and drain layers 108a, 108b.

A method for fabricating the semiconductor device will be described below.

FIGS. 13A to 13E are cross-sectional views illustrating an exemplary method for fabricating a semiconductor device according to the sixth embodiment of the present invention. A method for fabricating the semiconductor device shown in FIG. 12 will be described herein.

Figures 13A, 13B, 13C, 13D, 13E:
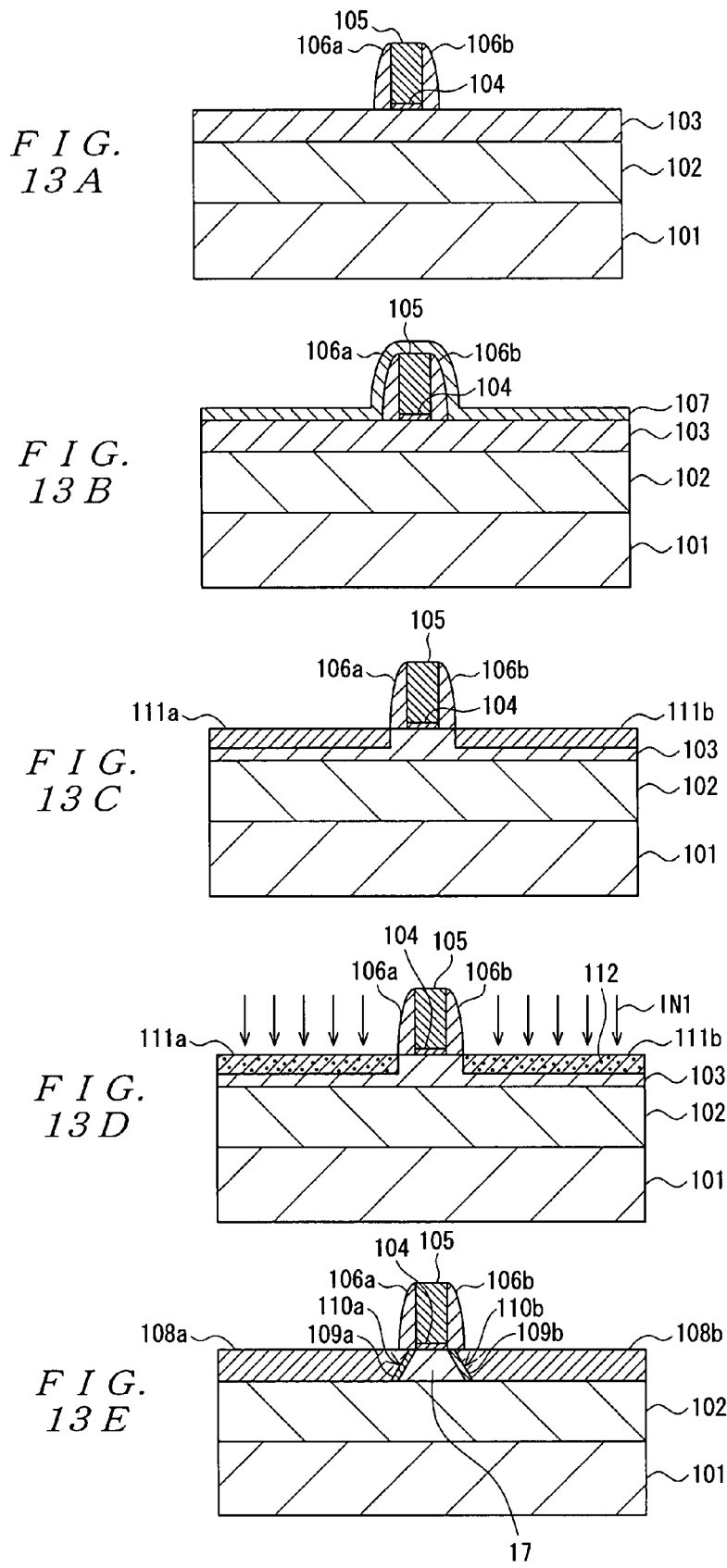

In FIG. 13A, an insulating layer 102 is formed on an underlying substrate 101 and a single-crystal Si layer 103 is formed on the insulating layer 102. A gate insulating film 104 is then formed on the surface of the Si layer 103 by applying thermal oxidation to the surface of the Si layer 103. A dielectric film is formed on the Si layer 103 with the gate insulating film 104 formed thereon by using a method such as CVD. The dielectric film is then patterned by using a photolithography technique and an etching technique to form a gate electrode 105 on the Si layer 103. An insulating layer is formed over the entire surface of the Si layer 103 by using CVD and the insulating layer is etched back using anisotropic etching such as RIE to form sidewalls 106a, 106b on the side surfaces of the gate electrode 105.

Then, a nickel disilicide ($NiSi_2$) is formed on the Si layer 103 with the sidewalls 106a, 106b formed thereon. The $NiSi_2$ may be formed on the Si layer 103 by using any of the methods for forming $NiSi_2$ described with respect to the first to fifth embodiments.

For example, if the $NiSi_2$ layer is to be formed by using the method described in the first embodiment, a sputtering system 10 having a chamber 9 capable of providing a high vacuum is provided and a Ni target 8 is placed in the sputtering system 10. Then, a wafer (an SOI substrate in this example) is placed at a position opposed to the Ni target 8 in the chamber 9 evacuated to a high degree of vacuum, and a gas mixture of Ar and $N_2$ gases is introduced in the chamber 9. A plasma is generated from the gas mixture to sputter a Ni film on the wafer.

In this way, the Ni film 107 is formed on the Si layer 103 with the sidewalls 106a, 106b formed thereon as shown in FIG. 13B.

Then, as shown in FIG. 13C, the Si layer 103 with the Ni film 107 formed thereon is heat-treated (annealed) to cause the Si layer 103 and the Ni film 107 to react with each other, thereby forming on the Si layer 103, $NiSi_2$ layers 111a, 111b on the sides of the sidewalls 106a, 106b. The annealing conditions may be in a $N_2$ atmosphere (100%) at atmospheric pressure (i.e. approximately 1 atmosphere) at a temperature in the range from 400° C. (including) to 800° C. (excluding), preferably in the range from 500° C. (including) to 600° C. (including). After the $NiSi_2$ layers 111a, 111b are formed, unreacted portions of the Ni film 107 are removed by wet etching of the Ni film 107.

Then, as shown in FIG. 13D, the gate electrode 105 and the sidewalls 106a, 106b are used as a mask to dope the $NiSi_2$ layers 111a, 111b with an impurity 112 such as As, P, or B by ion implantation IN1. Then, as shown in FIG. 13E, the Si layer 103 is heat-treated with the impurity 112 implanted in the $NiSi_2$ layers 111a and 111b to form junctions with the $NiSi_2$ layers 111a and 111b along the crystal orientation planes 110a and 110b, respectively, of the Si layer 103 while a source layer 108a and a drain layer 108b whose bottoms are in contact with the insulating layer 102 are formed from the $NiSi_2$ layers 111a and 111b respectively. Because the Si layer 103 is heat-treated with the impurity 112 implanted in the $NiSi_2$ layers 111a and 111b, part of the impurity 112 implanted in the $NiSi_2$ layers 111a and 111b diffuses into the Si layer 103. As a result, impurity-doped layers 109a and 109b are formed at the interfaces with the source layer 108a and the drain layer 108b, respectively, in a self-aligned manner.

Thus, the source layer 108a and the drain layer 108b can be formed in the $NiSi_2$ layer that extends the full depth of the Si layer 103 while extending the channel region 17 in its depth direction. In addition, impurity 112 driven out of the $NiSi_2$ layers 111a and 111b can be diffused into the Si layer 103 to form the impurity-doped layers 109a and 109b, respectively, along the interface between the source and drain layers 108a and 108b and the Si layer 103 in a self-aligned manner. Therefore, even though the $NiSi_2$ layer is formed in the source layer 108a and the drain layer 108b in such a manner that its bottom is in contact with the insulating layer 102, the $NiSi_2$ layer can be prevented from contacting a channel region of the Si layer 103. Thus, the resistance of the source layer 108a and the drain layer 108b can be reduced while suppressing junction leakage, and, in addition, an energy barrier in a deep region of the channel where the effect of the gate electrode 105 can not reach can be increased to suppress a short channel effect.

Furthermore, because the impurity 112 is diffused into the Si layer 103 through the $NiSi_2$ layers 111a and 111b, the temperature required for introducing the impurity 112 into the Si layer 103 can be reduced and therefore damage to a metal gate and a high dielectric insulating film can be suppressed. In addition, the need for directly applying ion implantation IN1 to the Si layer 103 to introduce impurity 112 into the Si layer 103 can be eliminated and therefore the possibility of occurrence of crystal defects in the channel region 17 can be reduced.

(7) Seventh Embodiment

FIGS. 14A to 14C are cross-sectional views illustrating a method for fabricating a semiconductor device according to a seventh embodiment of the present invention. In FIG. 14A, an insulating film 113 is deposited on the entire surface of the single-crystal Si layer 103 by using a CVD method or the like after the process step shown in FIG. 13E. In the seventh embodiment, a dummy gate electrode 105' is formed in place of the gate electrode 105 before performing the process shown in FIGS. 13A to 13E. The dummy gate electrode 105' may be an insulating material such as silicon oxide or silicon nitride. Then CMP (Chemical Mechanical Polishing) or etching is used to thin the insulating film 113 to expose the surface of the dummy gate electrode 105'.

Then, the dummy gate electrode 105' is removed by a method such as wet etching while leaving the insulating film 113 on the Si layer 103, thereby forming on the insulating film 113a, trench 114 between the sidewalls 106a and 106b as shown in FIG. 14B. A conductor film is formed on the insulating film 113 by using CVD or the like so that the trench 114 is filled with the insulating film 113 as shown in FIG. 14C. The conductor film is thinned by a method such as CMP to form the gate electrode embedded in the trench 114 on the Si layer 103.

Thus, the gate electrode 115 can be formed after formation of the impurity-doped layers 109a and 109b while maintaining the self-alignment of the gate electrode 115 to the impurity-doped layers 109a and 109b. Therefore, the gate electrode 115 can be prevented from being exposed to the thermal load required for forming the impurity-doped layers 109a and 109b and the gate electrode 115 can be readily metalized.

(8) Eighth Embodiment

While the sixth and seventh embodiments have been described with respect to a MOS transistor formed on an SOI substrate, the present invention is not limited to an SOI substrate on which MOS transistors are formed. A bulk silicon substrate may be used. The SOI substrate including the underlying substrate 101, the insulating layer 102, and the Si layer 103 shown in FIGS. 12 and 13A to 13E may simply be replaced with a silicon substrate. A specific example will be described below.

FIG. 15 is a cross-sectional view schematically showing a structure of a semiconductor device according to an eighth embodiment. In FIG. 15, a gate electrode 35 is disposed on the silicon substrate 31 with a gate insulating film 34 between them. A sidewall 36a is formed on one side surface of the gate electrode 35 and a sidewall 36b is formed on the other side surface of the gate electrode 35.

A source layer 38a of nickel disilicide ($NiSi_2$) embedded in the silicon substrate 31 is disposed on one side of the gate electrode 35. A junction of $NiSi_2$ of the source layer 38b to a channel region 37 is formed along a crystal orientation plane 40a of the silicon substrate 31. A drain layer 38b of $NiSi_2$ embedded in the silicon substrate 31 is disposed on the other side of the gate electrode 35. A junction of $NiSi_2$ of the drain layer 38b to the channel region 37 is formed along a crystal orientation plane 20b of the silicon substrate 31.

$NiSi_2$ of the source and drain layers 38a and 38b may be formed on the silicon substrate 31 using one of the methods for forming $NiSi_2$ described with respect to the first to fifth embodiments.

If the silicon substrate 31 is a (100) substrate, the crystal orientation planes 40a and 40b may be the (111) plane of the silicon substrate 31.

An impurity-doped layer 39a is formed at the interface between the $NiSi_2$ of the source layer 38a and the silicon substrate 31 in a manner that the impurity-doped layer 39a self-aligns along the interface with the silicon substrate 31. Also, an impurity-doped layer 39b is formed between the interface between $NiSi_2$ of the drain layer 38b and the silicon substrate 31 in such a manner that the impurity-doped layer 39b self-aligns along the interface with the silicon substrate 31. The impurity-doped layers 39a and 39b can be doped heavily enough to prevent energy barriers being formed between the impurity-doped layers 39a, 39b and $NiSi_2$ of the source and drain layers 38a, 38b.

Thus, the $NiSi_2$ films forming the source and drain layers 38a and 38b can be made thick while the channel region 37 is extended in the depth direction and the flatness of the junctions with the channel region 37 can be improved. In addition, the thickness of the impurity-doped layers 39a and 39b provided along the interface between $NiSi_2$ and the silicon substrate 31 can be made uniform. Therefore, if the $NiSi_2$ film formed on the silicon substrate 31 is thick, the $NiSi_2$ film can be prevented from contacting a channel region of the silicon substrate 31. Thus, the resistance of the source layer 38a and the drain layer 38b can be reduced while junction leakage is suppressed, and an energy barrier in a deep region of the channel where the effect of the gate electrode 35 cannot reach can be increased to suppress a short channel effect.

What is claimed is:

1. A method for forming a silicide, comprising the steps of:
    forming a nickel film on a silicon layer (or a silicon substrate) by sputtering nickel in an atmosphere comprising a gas mixture in which a partial pressure ratio of a nitrogen gas in the gas mixture is in a range from 10% (included) to 20% (included);
    after the forming of the nickel film introducing nitrogen into at least one of the nickel film and an interface between the nickel film and the silicon layer (or the silicon substrate); and
    after the introduction of the nitrogen, applying a heat treatment to the nickel film and the silicon layer (or the silicon substrate) under predetermined conditions to form a nickel disilicide layer,
    wherein at least one of the predetermined conditions is that a temperature in a chamber in which the heat treatment is performed is in a range of 400° C. (included) to 800° C. (excluded) in an atmosphere of pure nitrogen at a pressure of approximately 1 atmosphere.

2. The method for forming silicide according to claim 1, comprising the step of, prior to forming the nickel film, applying plasma processing to the surface of the silicon layer (or the silicon substrate) in an atmosphere including hydrogen gas.

3. The method for forming a silicide according to claim 1, comprising the step of, prior to forming the nickel disilicide layer, forming on the nickel film a cap film which inhibits diffusion of nitrogen from inside of the nickel film to the outside, wherein the step of forming the nickel disilicide layer applies the heat treatment to the nickel film covered with the cap film and the silicon layer (or the silicon substrate) under the predetermined conditions to form the nickel disilicide layer.

4. The method for forming silicide according to claim 1, wherein the predetermined conditions are that the pressure in the chamber in which the heat treatment is performed is atmospheric pressure and the temperature in the chamber is in the range from 500° C. (including) to 600° C. (including).

5. A method for fabricating a semiconductor device, comprising the steps of:
    forming a gate electrode on a silicon layer;
    forming a source/drain layer including a nickel disilicide layer joined with a channel region of the silicon layer;
    introducing impurities to the nickel disilicide layer; and
    driving the impurities introduced in the nickel disilicide layer into the silicon layer to form an impurity-doped layer at an interface between the nickel disilicide layer and the silicon layer, wherein the nickel disilicide layer is formed by performing the method for forming silicide according to claim 1.

6. A method for fabricating a semiconductor device, comprising the steps of:
   forming a dummy gate electrode on a silicon layer;
   forming a source/drain layer including a nickel disilicide layer joined with a channel region of the silicon layer;
   introducing an impurity into the nickel disilicide layer;
   driving a part of the impurity introduced in the nickel disilicide layer into the silicon layer to form an impurity-doped layer at the interface between the nickel disilicide layer and the silicon layer;
   forming on the silicon layer an insulating layer in which the dummy gate electrode is embedded;
   removing the dummy gate electrode embedded in the insulating layer to form a trench conformal to the dummy gate electrode in the insulating layer; and
   embedding a gate electrode in the trench;
   wherein the nickel disilicide layer is formed by performing the method for forming silicide according to claim 1.

7. A method for fabricating a semiconductor device, comprising the steps of:
   forming a gate electrode on a silicon layer disposed on an insulating layer;
   forming a sidewall insulator on a side surface of the gate electrode;
   forming a nickel disilicide layer laterally to the sidewall insulator;
   introducing an impurity into the nickel disilicide layer; and
   applying heat treatment to bring the bottom surface of the nickel disilicide layer into contact with the insulating layer to form from the nickel disilicide layer both a source/drain layer, and a junction of which exists along a crystal orientation plane of the silicon layer, and to diffuse a part of the impurity introduced in the nickel disilicide layer into the silicon layer to form an impurity-doped layer at an interface between the source/drain layer and the silicon layer:
   wherein the nickel disilicide layer is formed by performing the method for forming silicide according to claim 1.

8. A method for fabricating a semiconductor device, comprising the steps of:
   forming a gate electrode on a silicon substrate;
   forming a sidewall insulator on a side surface of the gate electrode;
   forming a nickel disilicide layer laterally to the sidewall insulator;
   introducing impurities into the nickel disilicide layer;
   forming, by heat treatment, from the nickel disilicide layer a source/drain layer whose junction with a channel region exists along a crystal orientation plane of the silicon substrate and diffusing the impurities introduced into the nickel disilicide layer into the silicon substrate to form an impurity-doped layer at an interface between the source/drain layer and the silicon substrate;
   wherein the nickel disilicide layer is formed by performing the method for forming silicide according to claim 1.

* * * * *